United States Patent
Hiura

(10) Patent No.: US 7,295,285 B2
(45) Date of Patent: Nov. 13, 2007

(54) EXPOSURE APPARATUS AND DEVICE MANUFACTURING METHOD

(75) Inventor: Mitsuru Hiura, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/387,683

(22) Filed: Mar. 24, 2006

(65) Prior Publication Data

US 2006/0214118 A1    Sep. 28, 2006

(30) Foreign Application Priority Data

Mar. 25, 2005    (JP)   ............................... 2005-088933

(51) Int. Cl.
*G03B 27/52*    (2006.01)
*G03B 27/42*    (2006.01)
*G02B 7/02*    (2006.01)

(52) U.S. Cl. ........................... 355/30; 355/53; 359/820

(58) Field of Classification Search .................. 355/30, 355/53, 67; 359/819–820
See application file for complete search history.

(56) References Cited

U.S. PATENT DOCUMENTS

| | | | | |
|---|---|---|---|---|
| 6,501,533 B1 * | 12/2002 | Murata | ........................ | 355/53 |
| 6,891,175 B2 | 5/2005 | Hiura | ..................... | 250/492.22 |
| 6,992,306 B2 * | 1/2006 | Honda et al. | ............. | 250/492.2 |
| 7,006,194 B2 * | 2/2006 | Sumiyoshi et al. | ........... | 355/30 |
| 7,068,348 B2 * | 6/2006 | Hara | ........................... | 355/30 |
| 7,116,501 B2 * | 10/2006 | Sakamoto | .................... | 359/820 |
| 2005/0073663 A1 * | 4/2005 | Miyajima | .................... | 355/30 |
| 2006/0214118 A1 | 9/2006 | Hiura | ...................... | 250/492.2 |

FOREIGN PATENT DOCUMENTS

| | | |
|---|---|---|
| JP | 2001-143992 | 5/2001 |
| JP | 2004-193468 | 7/2004 |

* cited by examiner

*Primary Examiner*—Henry Hung Nguyen
(74) *Attorney, Agent, or Firm*—Fitzpatrick, Cella, Harper & Scinto

(57) ABSTRACT

An exposure apparatus which exposes a pattern of an original onto a substrate. The apparatus includes an optical system, including a reflective optical element, configured to conduct exposure light, a cooling mechanism configured to cool the reflective optical element included in the optical system, a detection unit configured to detect cooling information of the cooling mechanism and to produce a detection result, and a determination unit configured to determine optical characteristics of the reflective optical element, based on the detection result of the detection unit and a previously stored correlation between optical characteristics of the reflective optical element and the cooling information of the cooling mechanism.

10 Claims, 9 Drawing Sheets

EXPOSURE APPARATUS AND DEVICE MANUFACTURING METHOD

FIELD OF THE INVENTION

The present invention relates to an exposure apparatus and a device manufacturing method and, more particularly, to an exposure technique used in lithography for manufacturing a device, such as a semiconductor device, including an IC and an LSI, a liquid crystal device, an image sensing device including a CCD, and a magnetic head.

BACKGROUND OF THE INVENTION

Along with recent demands for downsizing and thickness reduction of an electronic device, requirements increase for a smaller feature size of a semiconductor element to be mounted on the electronic device. Conventionally, in lithography, to manufacture a semiconductor element, reduction projection exposure using ultraviolet rays is performed. The minimum size that can be transferred by reduction projection exposure is proportional to the wavelength of light used for the transfer, and inversely proportional to the numerical aperture of a projection optical system. Hence, in order to transfer a smaller microcircuit pattern, the wavelength of exposure light to be employed decreases, such as a mercury lamp i-line (wavelength: 365 nm), a KrF excimer laser (wavelength: 248 nm), and an ArF excimer laser (wavelength: 193 nm).

The feature size of the semiconductor device is decreasing rapidly, and lithography using ultraviolet light has limitations in dealing with the small feature size. In order to efficiently transfer a very small microcircuit pattern of as small as less than 0.1 µm, a projection exposure apparatus which uses extreme ultraviolet light (EUV light) having a wavelength of about 10 nm to 15 nm, which is much shorter than that of ultraviolet rays, has been developed.

As an EUV light source, for example, a laser plasma light source is used. The laser plasma light source irradiates a target member placed in a vacuum container with a high intensity pulse laser beam using a YAG laser, or the like, to generate a high temperature plasma, so as to utilize EUV light having a wavelength of, e.g., about 13.5 nm, which is generated by the YAG target. As the target member, a thin metal film, inert gas, droplets, or the like, is used, and is supplied into the vacuum chamber by a means such as a gas jet. To increase the average intensity of the EUV light radiated from the target, the higher the repetition frequency of the pulse laser, the better. Usually, the EUV light source is operated at a repetition frequency of several kHz.

When the target is irradiated with the high-intensity pulse laser beam, the target generates not only EUV light, but also scattering particles called debris. If the debris attaches to an optical element, it may contaminate, damage, and decrease the reflectance of the optical element. Hence, a debris removing means which prevents the debris on the target from reaching the optical element has been employed.

In order to facilitate the debris to flow into an illumination optical system, preferably, an EUV light condenser mirror is an elliptical mirror, which has one focal point at a point where a plasma is generated and focuses light on the other focal point. Preferably, the path that connects a light source portion and an illuminating portion is physically narrow.

In an exposure apparatus shown in FIG. 6, each of the substrates of a condenser mirror 508, mirrors that constitute an illumination optical system 520, a mask 521, and mirrors that constitute a projection optical system 522 have several tens of pairs of multilayered films made of Mo, Si, and the like, in order to reflect EUV light 506 efficiently. Each multilayered film must have a surface roughness on the Å order by a standard deviation in order to suppress a decrease in reflectance of the EUV light. Even so, the actually obtained reflectance is about 60% to 70% at most. Namely, the remaining 30% to 40% of the EUV light is absorbed by the mirror and converted into heat to undesirably increase the temperature of the substrate. As an example, assume that the respective mirrors uniformly have reflectances of 65% and that the EUV light is reflected thirteen times, including reflection by the illumination optical system 520, mask 521, and projection optical system 522, $0.65^{13}=0.0037$ of the light reaches the surface of a wafer 523. In other words, only 0.37% of the EUV light extracted from the light source portion reaches the surface of the wafer 523, and the remaining 99.63% of the light is absorbed by the constituent elements, i.e., the illumination optical system 520, mask 521, and projection optical system 522. As is apparent from this example, in an EUV exposure apparatus, an optical system that satisfies a desired optical performance with a smaller number of mirrors must be achieved.

In order to achieve the desired optical performance, for example, in order to suppress the decrease in reflectance, the mirrors of the projection optical system 522 must have, not only a smaller surface roughness, but also shape accuracy on the Å order by standard deviation. A very accurate optical system is thus required. Accordingly, the stability of the optical system 522 against external factors, such as the temperature, must naturally be very high. As a result, sufficient consideration must be made against heat obtained by conversion of absorbed EUV light, as described above.

In order to improve the productivity of the exposure apparatus, as much EUV light as possible must be supplied onto the surface of the wafer 523. To achieve this, the reflectances of the respective mirrors must be increased, the number of mirrors to be used must be decreased, and simultaneously, the EUV light to be output from the light source portion must be increased. In this case, the mirrors of the illumination optical system 520, which are close to the light source portion, receive a large quantity of EUV light and absorb 30% to 40% of the EUV light in the form of heat. While the illumination optical system 520 does not require a shape accuracy as high as that required by the projection optical system 522, it is exposed to the intense EUV light output from the light source portion. Thus, sufficient consideration must be made against the quantity of heat absorbed by the illumination optical system 520, which is greatly larger than that of heat absorbed by the projection optical system 522.

As the EUV light is readily absorbed by the atmosphere, the optical path space for it must be a vacuum environment, as described above. Therefore, to remove the heat absorbed by the mirrors, a cooling system employing heat exchange with a temperature-regulated gas, which is generally used in a conventional exposure apparatus cannot be employed. In the case of an EUV exposure apparatus employing a vacuum atmosphere, a temperature regulating medium must be directly brought into contact with the mirrors to remove by heat transfer the heat absorbed by the mirrors. Alternatively, heat absorbed by the mirrors must be removed by radiant heat using a vacuum. In any case, because of the vacuum environment, the optical system cannot be entirely temperature controlled by temperature regulated gas. Hence, a temperature regulating systems must be provided for the respective mirrors or each for several mirrors individually.

In the EUV exposure apparatus, the system having the individual temperature regulating systems for the respective mirrors or each of the several mirrors is a basic constituent element considering heat absorption by the mirrors, the high accuracy demand for the mirror shapes, and the vacuum environment on the optical path.

EUV exposure apparatuses are described in Japanese Patent Laid Open No. 2004-193468 and No. 2001-143992.

The optical path is set in a vacuum environment in order to exclude an atmosphere, which absorbs the EUV light. The EUV light has a very short wavelength, i.e., 13.5 nm in the soft X-ray range. Even in the vacuum, the mirror surface is contaminated by a contaminant due to the mutual operation of the remaining components on the mirror and EUV light to not only degrade the reflectance, but also degrade the uniformity. Consequently, good exposure is interfered with.

Contamination is roughly divided into two types, i.e., oxidation of a multilayered mirror film caused by the presence of water and contamination due to carbon, and is caused when the remaining components of water or carbon exist. The allowable amount of the residual components is said to be about $1\times10^{-7}$ Pa by partial pressure for water and about $1\times10^{-8}$ Pa by partial pressure for carbon molecules having a molecular weight of forty-four or more. A very strict vacuum degree is thus required. For this reason, that member to be formed in the vacuum chamber of the exposure apparatus, which causes outgassing must have a surface area as small as possible, and must be made of such a material or be subjected to such a special process that outgassing of a gas containing a material, which generates the partial pressure, does not occur. To decrease the surface area which causes outgassing and to decrease the special material or process is very significant in apparatus design, because they are directly related to the apparatus cost.

Regarding cleaning and removal of a contaminant once attaching to the mirror, intensive studies are made on cleaning and removing carbon while maintaining the surface roughness on the Å level. Once the contaminant is oxidized, however, it cannot be cleaned or removed, and no means is available, but to exchange the mirror itself when the reflectance of the mirror decreases by a certain degree.

Regarding the decrease in reflectance, the rate of decrease of the entire optical system ranging from the illumination optical system 520 to the projection optical system 522 can be detected by mounting an exposure dose sensor (not shown) on the wafer stage and measuring the reflectance periodically. This is the same as in a conventional KrF exposure apparatus having a wavelength of 248 nm and a conventional ArF exposure apparatus having a wavelength of 193 nm.

With this sensor, however, which mirror has the problem cannot be identified, and an appropriate measure cannot be taken against the inconvenience of the decrease in reflectance, so the apparatus downtime increases. Particularly, as the EUV exposure apparatus employs a vacuum environment, if the apparatus is open to the atmosphere in order to inspect a component, or the like, in the apparatus, restoration of the apparatus takes a considerable amount of time, on the order of many days, thus adversely affecting the productivity of the apparatus.

In order to avoid this problem, a new detection system which detects a decrease in reflectance of the mirror or the contamination itself may be formed in the optical path. In this case, to achieve a clean, high vacuum degree with few residual components that cause contamination, as described above, such a new detection system, which may lead to an increase in outgassing should not be formed in the vacuum chamber, if it is possible.

SUMMARY OF THE INVENTION

The present invention has been made in view of the above background, and has as its exemplary object to provide a novel technique, which determines a decrease in reflectance of an optical element.

In order to solve the above problem and to achieve the above object, according to the first aspect of the present invention, there is provided an exposure apparatus, for exposing a substrate to light via a reticle, comprising a reflective optical system including a plurality of reflective optical elements and configured to conduct the light, a cooling mechanism configured to cool a first optical element included in the reflective optical system and arranged on an optical path of the reflective optical system, and a controller configured to detect a load of the cooling mechanism and to determine a decrease in reflectance of at least one of the plurality of reflective optical elements based on the detected load.

In the above aspect, the first optical element is one of the plurality of reflective optical elements.

In the above aspect, the first optical element is a light absorber configured to be retractable from the optical path and to absorb the light.

In the above aspect, the first optical element is an aperture stop arranged on the optical path.

In the above aspect, the cooling mechanism is arranged with respect to each of the plurality of reflective optical elements.

In the above aspect, the cooling mechanism is configured to supply coolant to the first optical element, and the controller is configured to detect temperature of the supplied coolant as the load.

In the above aspect, the cooling mechanism includes a heater and is configured to supply coolant heated by the heater to the first optical element, and the controller is configured to detect as the load a load of the heater.

In the above aspect, the cooling mechanism includes a radiator configured to radiate heat to the first optical element and a Peltier element configured to cool the radiator, and the controller is configured to detect as the load a load of the Peltier element.

In the above aspect, the apparatus further comprises an indicator configured to give notice concerning a determination made by the controller.

In the above aspect, the apparatus further comprises a light source configured to generate as the light extreme ultraviolet light.

According to the second aspect of the present invention, there is provided a method of manufacturing a device, comprising the steps of exposing a substrate to light via a reticle using an exposure apparatus as defined above, developing the exposed substrate, and processing the developed substrate to manufacture the device.

Other objects and advantages besides those discussed above shall be apparent to those skilled in the art from the description of a preferred embodiment of the invention which follows. In the description, reference is made to the accompanying drawings, which form a part thereof, and which illustrate an example of the invention. Such an example, however, is not exhaustive of the various embodiments of the invention, and, therefore, reference is made to the claims which follow the description for determining the scope of the invention.

DETAILED DESCRIPTION OF THE PREFERRED EMBODIMENTS

The preferred embodiments of the present invention will be described in detail with reference to the accompanying drawings.

The embodiments to be described hereinafter are examples as a means to implement the present invention, and should be appropriately modified or changed depending on the arrangement and various conditions of an apparatus to which the present invention is to be applied. The present invention can also be applied to various types of precision machining apparatuses and various types of precision measurement apparatuses as well as to a semiconductor exposure apparatus used for the manufacture of a semiconductor device, a liquid crystal device, and the like.

First Embodiment

Figure 6:
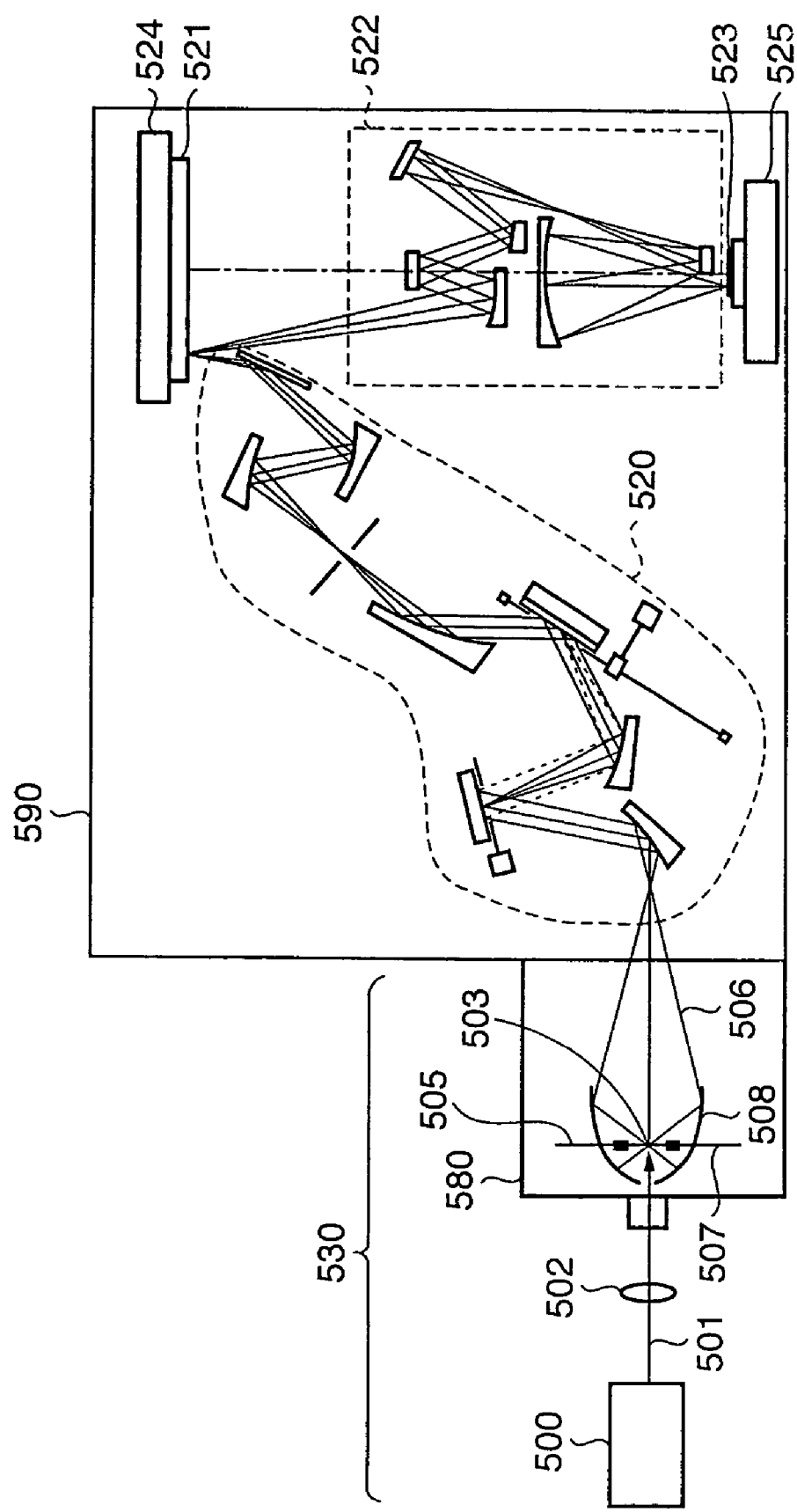
FIG. 6 is a view showing the schematic structure of the exposure apparatus according to the first embodiment of the present invention.

FIG. 6 is a view showing the schematic structure of an EUV exposure apparatus according to the first embodiment.

The EUV exposure apparatus according to this embodiment is an exposure apparatus, which performs exposure by scanning using EUV light (having a wavelength of, e.g., 13.5 nm) as exposure light.

Referring to FIG. 6, the EUV exposure apparatus has a laser plasma light source portion 530, an illumination optical system 520, a reflective reticle or mask (the terms reticle and mask are interchangeably used in this embodiment) 521, projection optical system 522, reticle stage 524, wafer 523, and wafer stage 525. The components ranging from the illumination optical system 520 to the wafer stage 525 are accommodated in a vacuum chamber 590. A light guide device in this embodiment comprises the laser plasma light source portion 530 and illumination optical system 520 in a narrow sense and includes the projection optical system 522, as well, in a broad sense.

In the laser plasma light source portion 530, a target supply system 505 arranged in a vacuum chamber 580 irradiates a target (not shown), which is supplied by a target supply system 505 to a focal point 503, with a high-intensity pulse laser beam 501 from a laser light source 500 via a focusing optical system 502. This causes the target to generate a high-temperature plasma. EUV light having a wavelength of about 13.5 nm emitted from the target is used. More specifically, the laser plasma light source portion 530 irradiates the target with the high luminance excitation pulse laser beam 501 to excite the target to a high temperature plasma state. Of light beams having a wavelength band including infrared light, ultraviolet light, and EUV light (extreme ultraviolet rays or X rays), which are isotropically radiated from the plasma while the plasma cools, the condenser mirror 508 condenses EUV light and uses it as exposure light. For example, the pulse laser beam 501 is an Nd:YAG laser, an excimer laser, or the like.

As the target described above, a thin metal film of Cu, Li, Zn, or the like, an inert gas such as Xe, droplets, or the like, is used, and is supplied into the vacuum chamber 580 by the target supply system 505, such as a gas jet. Of the above targets, Xe is promising because of the problem that debris, which is simultaneously generated when the EUV light is generated, may undesirably contaminate another illumination system, the conversion efficiency from the excitation pulse laser beam 501 into the EUV light 506, a reason concerning handling of the target, and the like. As the supplied target does not entirely contribute to plasmatization, a target recovery system 507, which recovers the remaining target, is set.

The EUV light is exemplified by the plasma excitation laser. Alternatively, an undulator may be used or a discharge method may be employed, as a matter of course.

The EUV light 506 guided into the vacuum chamber 590 is further guided via the illumination optical system 520 comprising a plurality of mirrors to illuminate the reflective mask 521 having a predetermined pattern with a uniform arcuate illumination beam spot.

The EUV light 506 electively reflected by the reflective mask 521 is reduced and projected by the projection optical system 522 comprising a plurality of mirrors onto the wafer 523 applied with a resist, to transfer the pattern on the mask 521 onto the wafer 523.

The illumination region to the mask 521 and the projection image of the wafer 523 are limited within very narrow arcuate ranges having the same image height, so that a good image in which the aberration of the projection optical system 522 is suppressed, can be obtained. In order to expose the pattern formed on the mask 521 entirely onto the wafer 523, this exposure apparatus employs a so-called scan exposure scheme of performing exposure while scanning the reticle stage 524 and wafer stage 525 in a sync manner.

One of the characteristic features of this embodiment resides in that decreases in reflectance of the mirrors can be detected using temperature regulating systems provided to the respective mirrors of the illumination optical system 520 and projection optical system 522 of the above exposure apparatus, without requiring a separate reflectance detection system.

Figure 1:
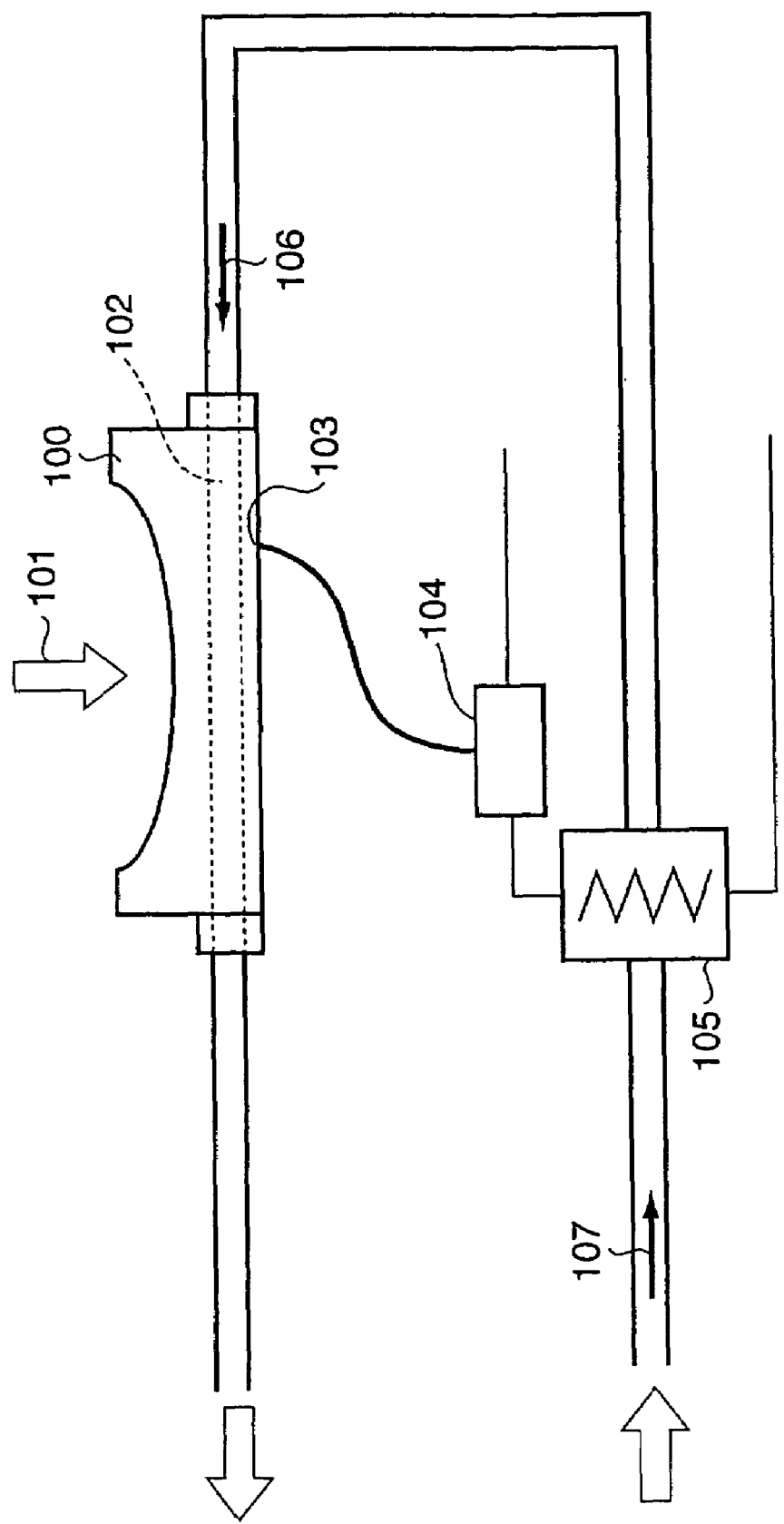
FIG. 1 is a view showing the schematic structure of a temperature regulating system according to the first embodiment of the present invention.

FIG. 1 schematically shows one of the temperature regulating systems provided to the respective mirrors.

A multilayered film (not shown), which reflects EUV light 101, is formed on a mirror 100, and the EUV light 101 as a heat source is supplied to the mirror 100. Thirty percent to forty percent of the EUV light 101 is absorbed by the mirror 100. A channel 102 is formed in the mirror 100 so the temperature of the mirror 100 itself will not increase to thermally deform the mirror 100. A temperature regulating medium 106, which is regulated to a target temperature, is supplied to the mirror 100 so that heat is exchanged between the mirror 100 and the temperature regulating medium 106 and removed from the mirror 100. The target temperature of the temperature regulating medium 106 is determined by a temperature regulator (also called a temperature controller or cooling mechanism) 104 on the basis of measurement performed by a temperature sensor 103 provided to the mirror 100. The temperature regulator 104 controls a heater 105 so as to heat a temperature regulating medium (also called a coolant) 107, which is cooled to a constant temperature, to the target temperature. The temperature regulating medium, which is temperature-regulated by this control operation, is supplied to the mirror 100. The heater 105 is adjusted by a current, or the like.

Figure 2A:
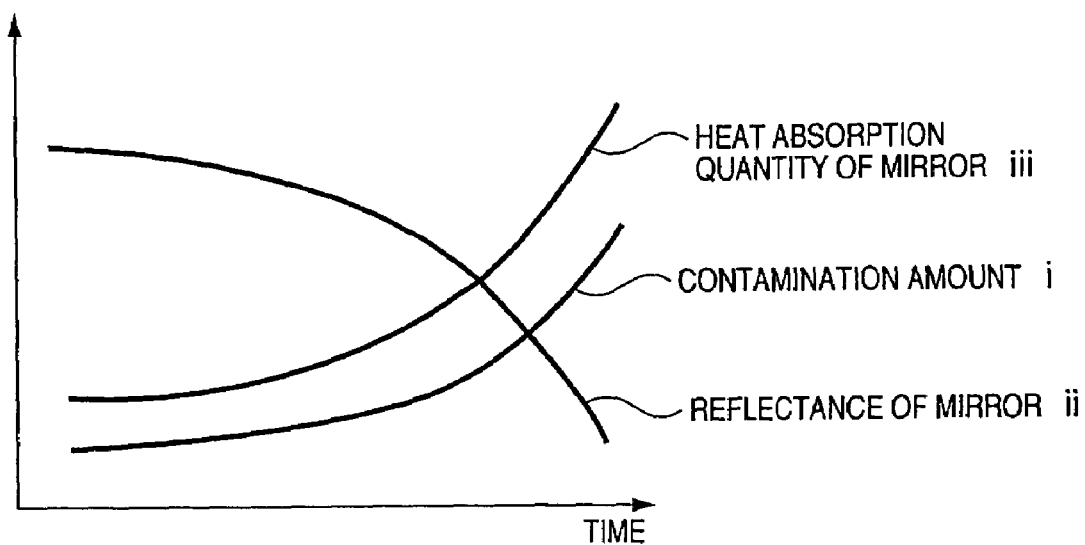
FIGS. 2A and 2B are graphs showing the effect obtained by the temperature regulating system and a method of detecting a decrease in reflectance of a mirror according to the first embodiment of the present invention.
Figure 2B:
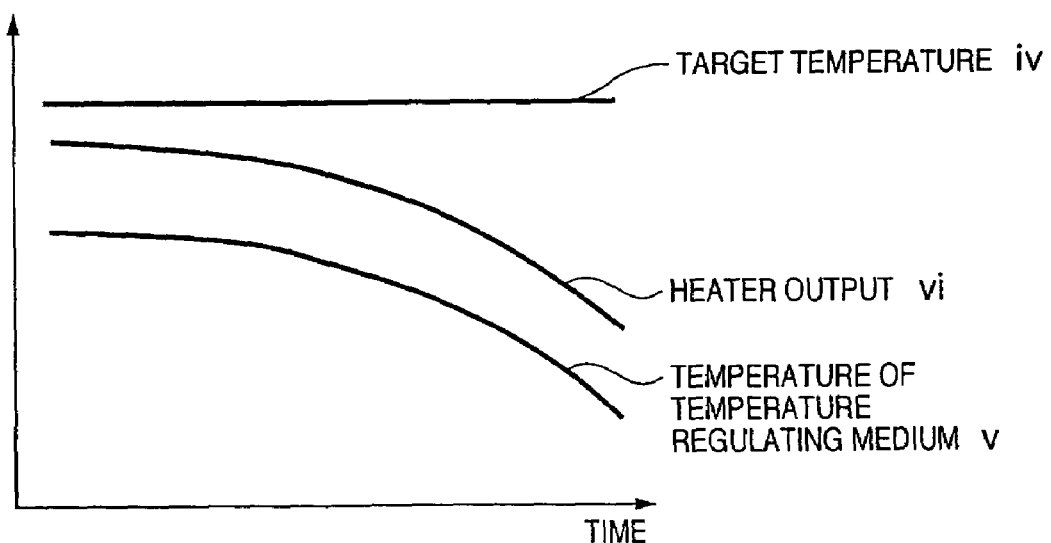

A case will be described with reference to FIGS. 2A and 2B, wherein a contaminant attaches to the mirror 100 while the same quantity of EUV light 101 is radiated from the light source and the optical conditions, such as an aperture, are the same.

As time passes, the contaminant increases (1), and, accordingly, the reflectance decreases gradually (2). Conversely to the decrease in reflectance, the heat absorption quantity of the mirror 100 increases (3). The temperature of the mirror 100 itself must be suppressed to the target temperature regardless of contaminant attaching, or the like (4). Hence, the temperature regulating medium 106 having a lower temperature is supplied in order to exhaust heat absorbed by the mirror 100 (5). Namely, the temperature regulating medium 107, which is cooled to the constant temperature, need not be greatly heated by the heater 105, and an output value from the heater 105 decreases (6).

Information on the correlation between the reflectance (2) and the output value (6) of the heater 105 is acquired in advance experimentally or by simulation and stored in a controller arranged in the EUV exposure apparatus. An appropriate threshold may be set for the output value (6) of the heater 105 or the output value may be referred to so as to discriminate that the reflectance of the mirror 100 has decreased by about a predetermined degree, or a decrease in the amount of the reflectance.

Figure 3:
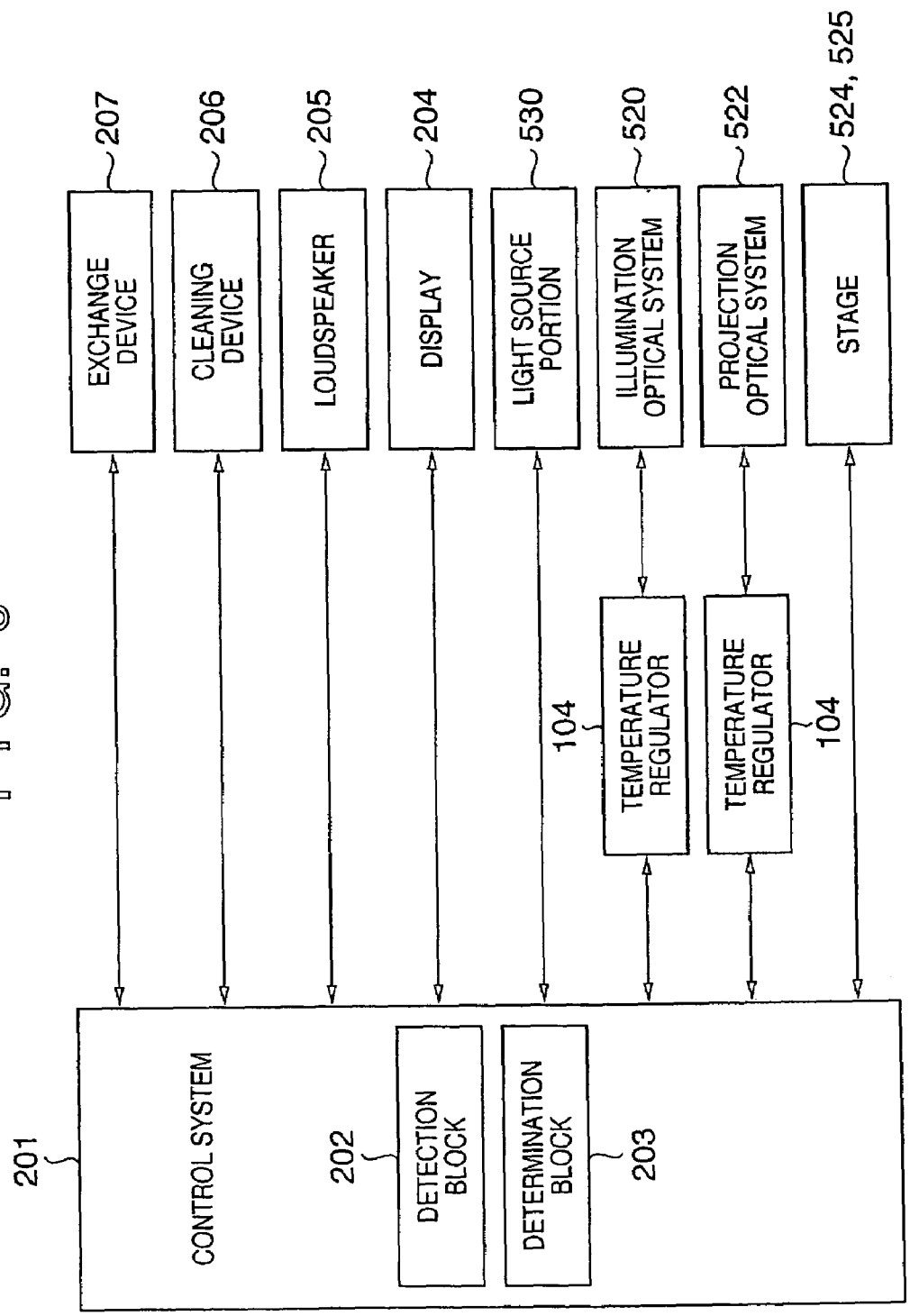
FIG. 3 is a block diagram of a control system mounted in an exposure apparatus according to the first embodiment of the present invention.

Detection of the decrease in reflectance of the mirror is performed during exposure or non-exposure, and implemented by a control system 201 of the EUV exposure apparatus of this embodiment, as shown in FIG. 3. More specifically, a detection block 202 detects the load (including a physical amount correlated to this load) of the temperature regulator 104 serving as a temperature regulating means which is provided to each of the mirrors 100 that form the illumination optical system 520 and projection optical system 522. For example, this load is a physical amount (an output value as the first information), which represents the capability of the heater 105 to control the temperature of the temperature regulating medium to the predetermined temperature. A determination block 203 acquires the optical characteristics (a reflectance as the second information) of the mirror from the stored information on the basis of the detection performed by the detection block 202, and checks on the basis of the acquired information whether the optical characteristics have changed (whether the reflectance has decreased).

A display 204 and loudspeaker 205 serving as a warning means are also provided. When the determination block 203 determines that the optical characteristics of the mirror 100 have changed beyond a predetermined range (allowable range), the display 204 and loudspeaker 205 make a warning by displaying the determination result on the display 204 or producing an alarm from the loudspeaker 205.

A cleaning device 206 is provided as a cleaning means. When the determination block 203 determines that the optical characteristics of the mirror 100 have changed beyond the predetermined range, the cleaning device 206 (automatically) cleans the mirror 100.

The display 204, loudspeaker 205, and the like, also serve as an informing means. When the determination block 203 determines that the optical characteristics of the mirror 100 have changed beyond the predetermined range, the informing means informs this to prompt the operator to replace the mirror 100. A device 207, which removes the mirror 100 and exchanges it with a new mirror, can also be provided.

The control system 201 is configured to control light emission by the laser plasma light source portion 530 and control the reticle stage 524 and wafer stage 525 to scan synchronously so that the pattern on the mask 521 is reduced and projected onto the wafer 523 via the projection optical system 522 to expose the wafer 523.

According to this embodiment, since the temperature regulator 104 as shown in FIG. 1 is provided to each mirror, a mirror, the reflectance of which has decreased, can be identified. Thus, an appropriate measure can be taken without requiring a long apparatus downtime, and a decrease in productivity of the exposure apparatus can be minimized.

In the above example, the output value of the heater 105 is detected as a load. Note that the term "load" implies not only the load itself, but also a physical amount correlated to the load. For example, a value such as power, voltage, or current applied to the heater 105 may be detected as a load. The temperature of the temperature regulating medium 106 between the heater 105 and mirror 100 may be detected as a load. Some of these detecting operations may be combined to detect a load.

In the above embodiment, the temperature regulating medium 107, which has been once cooled to the constant temperature, is heated to the target temperature by the heater 105. The same effect can be expected with a system that conversely cools the temperature regulating medium, which has been heated to the constant temperature, to the target temperature, by a refrigerator.

A channel need not be formed in the mirror 100 to directly supply the temperature regulating medium 106 so as to exhaust heat, but a channel can be formed in that surface of the mirror 100, which is to be irradiated with the EUV light, or conversely to an opposite surface of the mirror 100.

Figure 4:
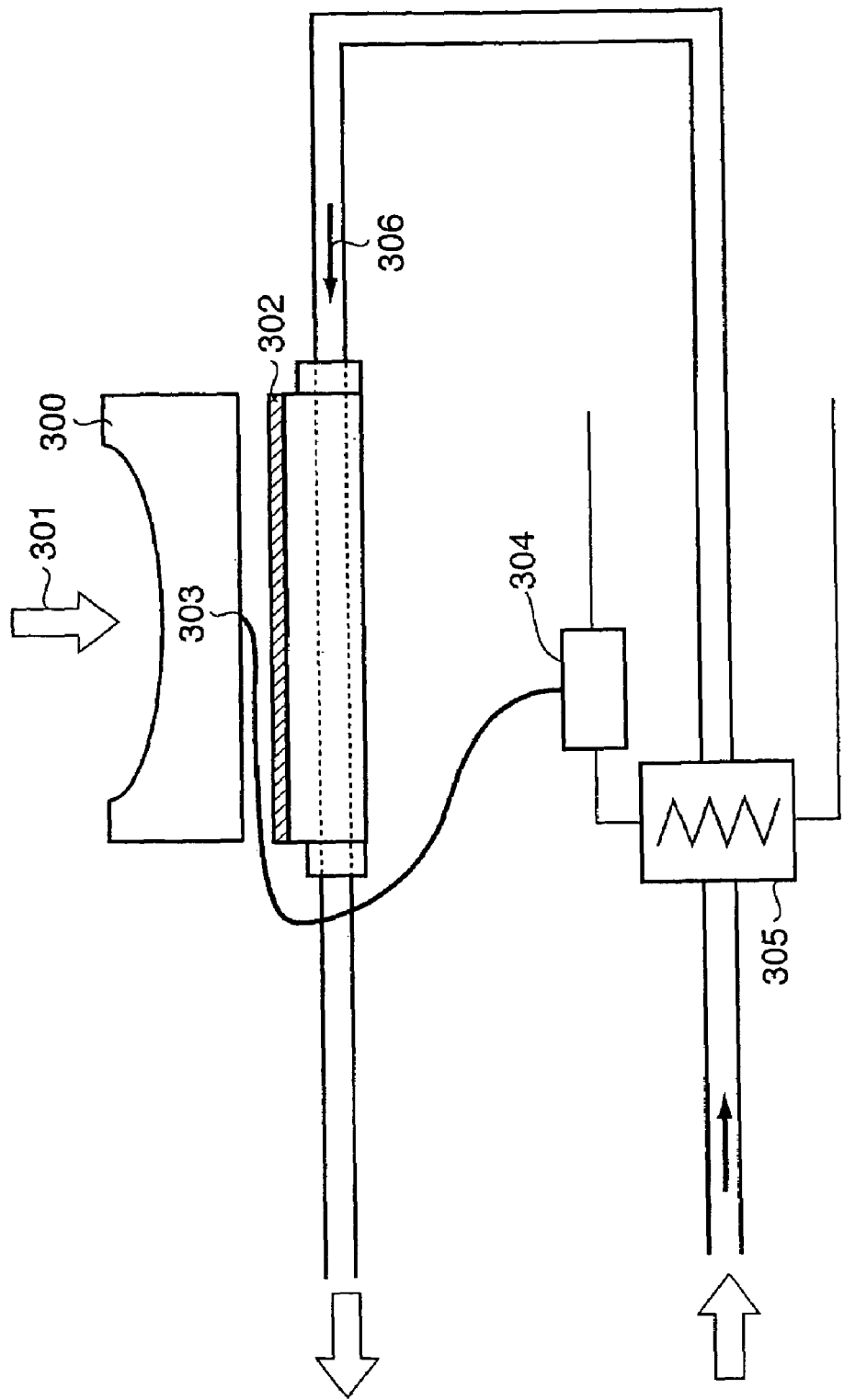
FIG. 4 is a view showing the schematic structure of a temperature regulating system according to a modification to the first embodiment of the present invention.
Figure 5:
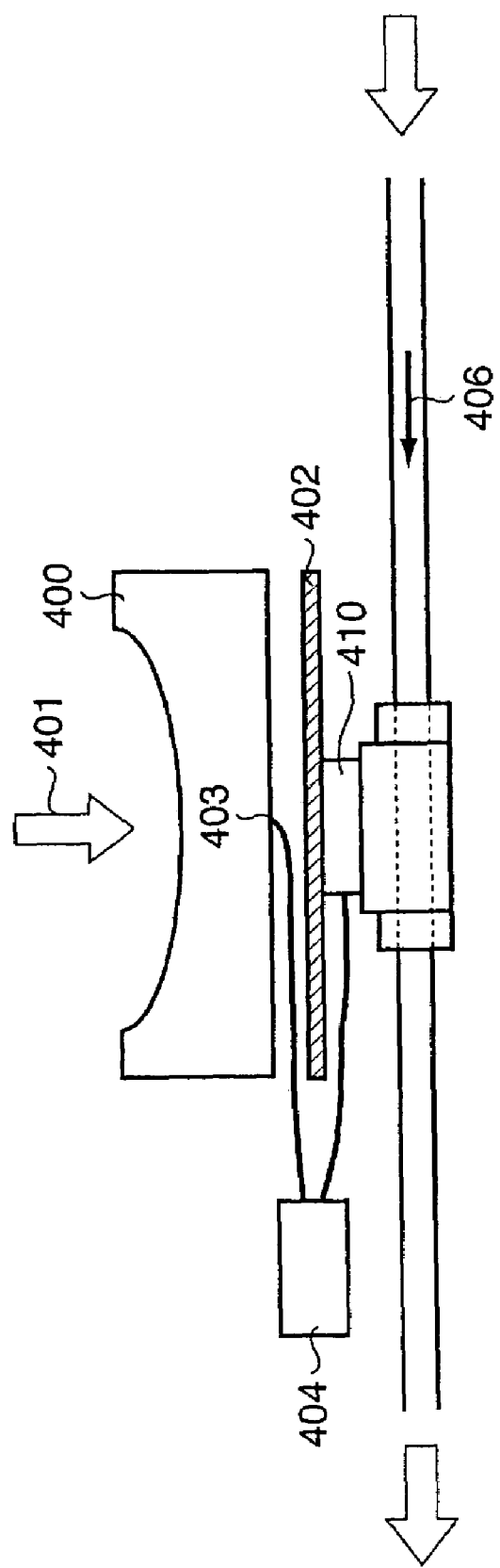
FIG. 5 is a view showing the schematic structure of a temperature regulating system according to another modification to the first embodiment of the present invention.

As shown in FIG. 4, a radiation plate 302, which is adjusted to a target temperature, can be arranged in the vicinity of a mirror 300. In this case, the same effect can be expected if a temperature regulating medium 306 which controls the temperature of the radiation plate 302 is replaced by the temperature regulating medium 106 described with reference to FIG. 1. Naturally, as shown in FIG. 5, a Peltier element 410 can be used to control the temperature of a radiation plate 402. In this case, a manipulated variable, or the like, such as the current or voltage of the Peltier element 410 may replace the controlled variable, such as the output, current, or voltage of the heater 105 described with reference to FIG. 1. A temperature regulating medium 406 which regulates the temperature of the Peltier element 410 can be replaced by the temperature regulating medium 106 described with reference to FIG. 1, and a temperature regulating means (not shown), which adjusts the temperature of the temperature regulating medium, can be used. Although the radiation plate 402 is set on the lower surface side of a mirror 400 in FIG. 4, it can be set on the upper surface side of the mirror 400.

Second Embodiment

Figure 7:
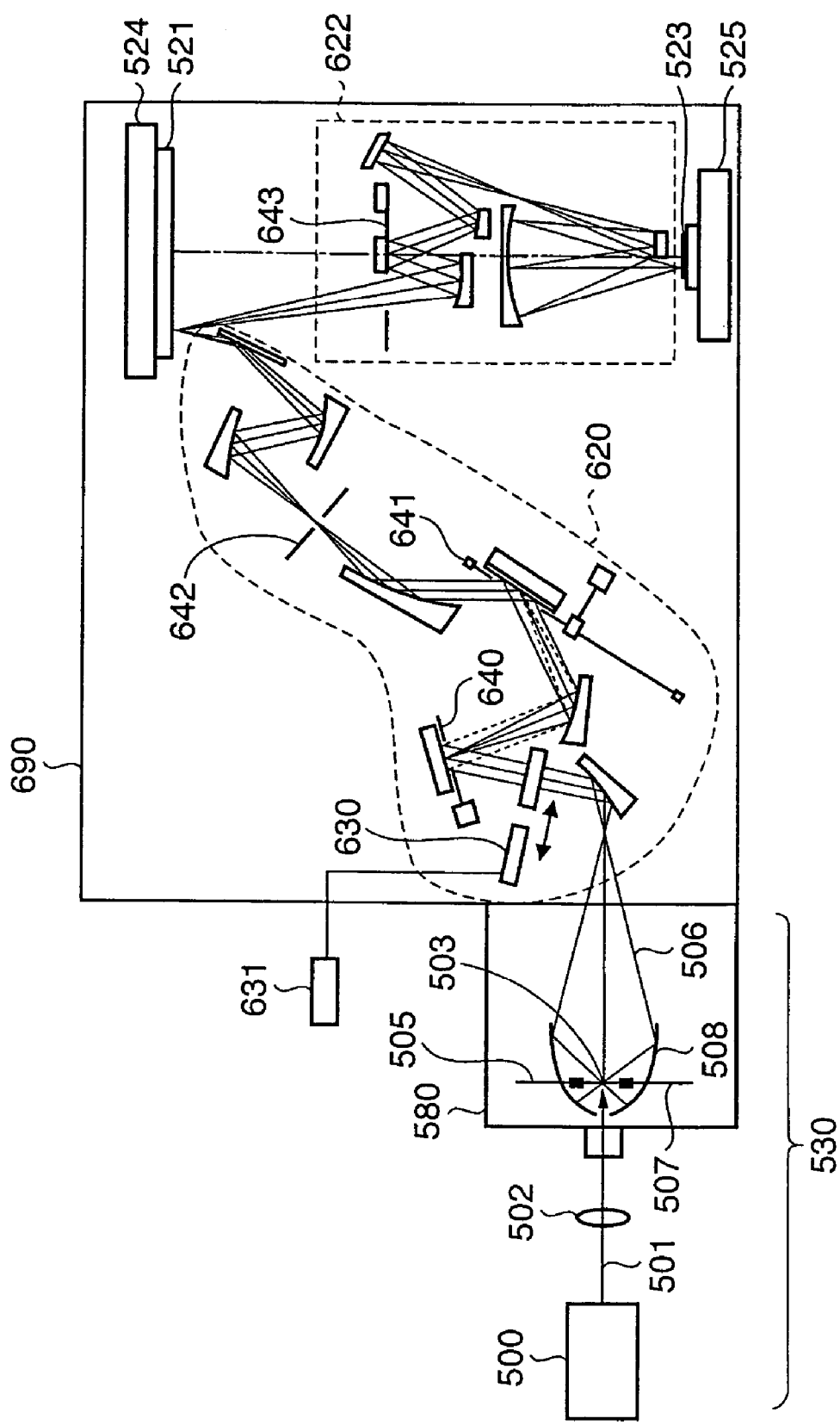
FIG. 7 is a view showing the schematic structure of an exposure apparatus according to the second embodiment of the present invention.

An EUV exposure apparatus according to the second embodiment of the present invention will be described with reference to FIG. 7. In the following description, identical elements as those in FIG. 6 are denoted by the same reference numerals, and a repetitive description thereof will be omitted.

According to this embodiment, a light absorbing member (also called a light absorber) 630, which absorbs EUV light, is retractably arranged on the optical path. When the absorbing member 630 is appropriately inserted in the optical path, it absorbs the EUV light in the same manner as a mirror, and its temperature increases. The second embodiment further has a temperature regulating system similar to that described in the first embodiment, so that radiation heat from the absorbing member 630, which is produced by the temperature increase is prevented from supplying heat to other neighboring members to deform them. Different from the mirror, the absorbing member 630 is preferably a member that absorbs the EUV light 100%.

The absorbing member 630 is interposed in the optical path to detect a decrease in reflectance. This detection mechanism is identical to that of the temperature regulating system of the first embodiment described above. In the second embodiment, since the absorbing member 630 is not a member that implements exposure, it can have a size and shape optimal for detection of a decrease in reflectance of an optical member, which is closer to the light source than the absorbing member 630, and can have high accuracy.

An actuator 631 to retract the absorbing member 630 is desirably arranged outside a vacuum chamber 690 from the viewpoint of suppressing outgassing.

Third Embodiment

An EUV exposure apparatus according to the third embodiment of the present invention will be described with reference to FIG. 7. In the following description, identical elements as those in FIG. 6 are denoted by the same reference numerals, and a repetitive description thereof will be omitted.

According to this embodiment, as the basic performance of the exposure apparatus, a stops or aperture stops 640 and 641, which determine the coherence factor of an illumination optical system 620 and a masking blade 642, which shapes the EUV light and determines an exposure area, are provided. A projection optical system 622 is provided with an NA stop or aperture stop 643, which determines the numerical aperture.

In an ordinary exposure operation, the respective stops are irradiated with excessive EUV light around their apertures. This may increase the temperatures of the respective stop members and deform the members themselves to degrade the accuracies of the stop shapes. Also, radiation heat generated by the temperature increase of the stop members may deform other neighboring members. Therefore, a temperature regulating system must be provided to each stop member.

According to the third embodiment, each stop is formed of the light absorbing member described in the second embodiment. In order to detect a decrease in reflectance, the stop is closed completely, so the EUV light can be absorbed entirely. Then, a decrease in reflectance of an optical member, which is closer to the light source than the stop, can be detected. This detection mechanism is identical to that described in the first embodiment.

According to the third embodiment, information on a decrease in reflectance can be obtained without adding any new constituent element (hardware). When the third embodiment is combined with the first embodiment, further detailed information can be acquired.

If the illumination optical system of the present invention is applied as a light guide device to another apparatus, other than the exposure apparatuses of the respective embodiments described above, the same effect can naturally be obtained.

[Device Manufacturing Method]

Figure 8:
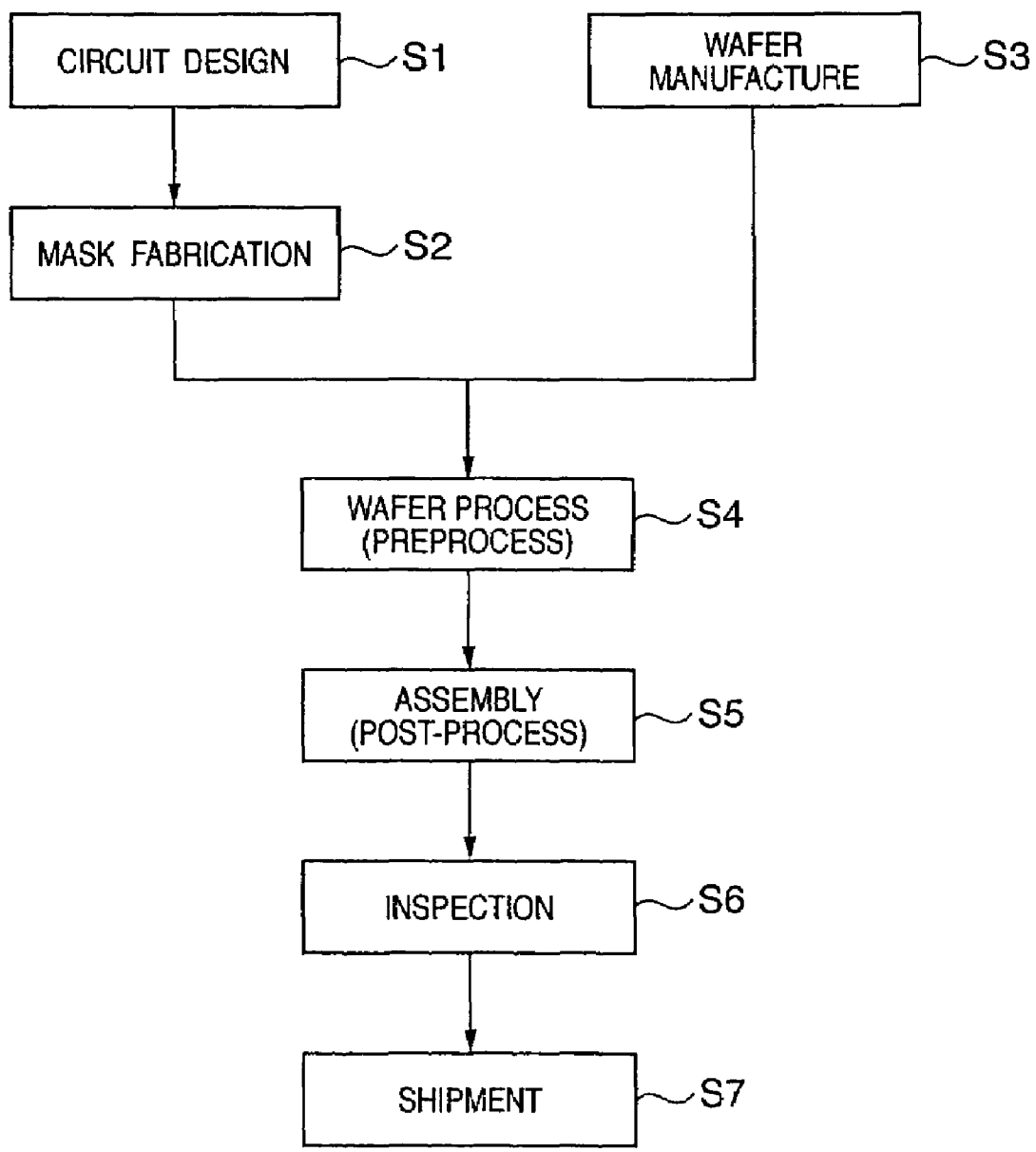
FIG. 8 is a flowchart for explaining a device manufacturing method which uses the exposure apparatus according to the second embodiment.

An embodiment of a device manufacturing method, which uses an exposure apparatus described above, will be described with reference to FIGS. 8 and 9. FIG. 8 is a flowchart to explain the manufacture of a device (e.g., a semiconductor chip such as an IC or LSI, an LCD, a CCD, or the like). This embodiment will be exemplified by the manufacture of a semiconductor chip. In step S1 (circuit design), a device is designed. In step S2 (mask fabrication), a mask (also called a reticle) having the designed circuit pattern is fabricated. In step S3 (wafer manufacture), a wafer having the designed circuit pattern is fabricated. In step S4 (wafer process), called a preprocess, an actual circuit is formed on the wafer in accordance with lithography using the mask and wafer. In step S5 (assembly), called a postprocess, a semiconductor chip is formed from the wafer formed in step S4. This step includes processes such as assembly (dicing and bonding) and packaging (chip encapsulation). In step S6 (inspection), inspections, such as an operation check test and a durability test of the semiconductor device formed in step S5, are performed. A semiconductor device is finished with these steps and shipped (step S7).

Figure 9:
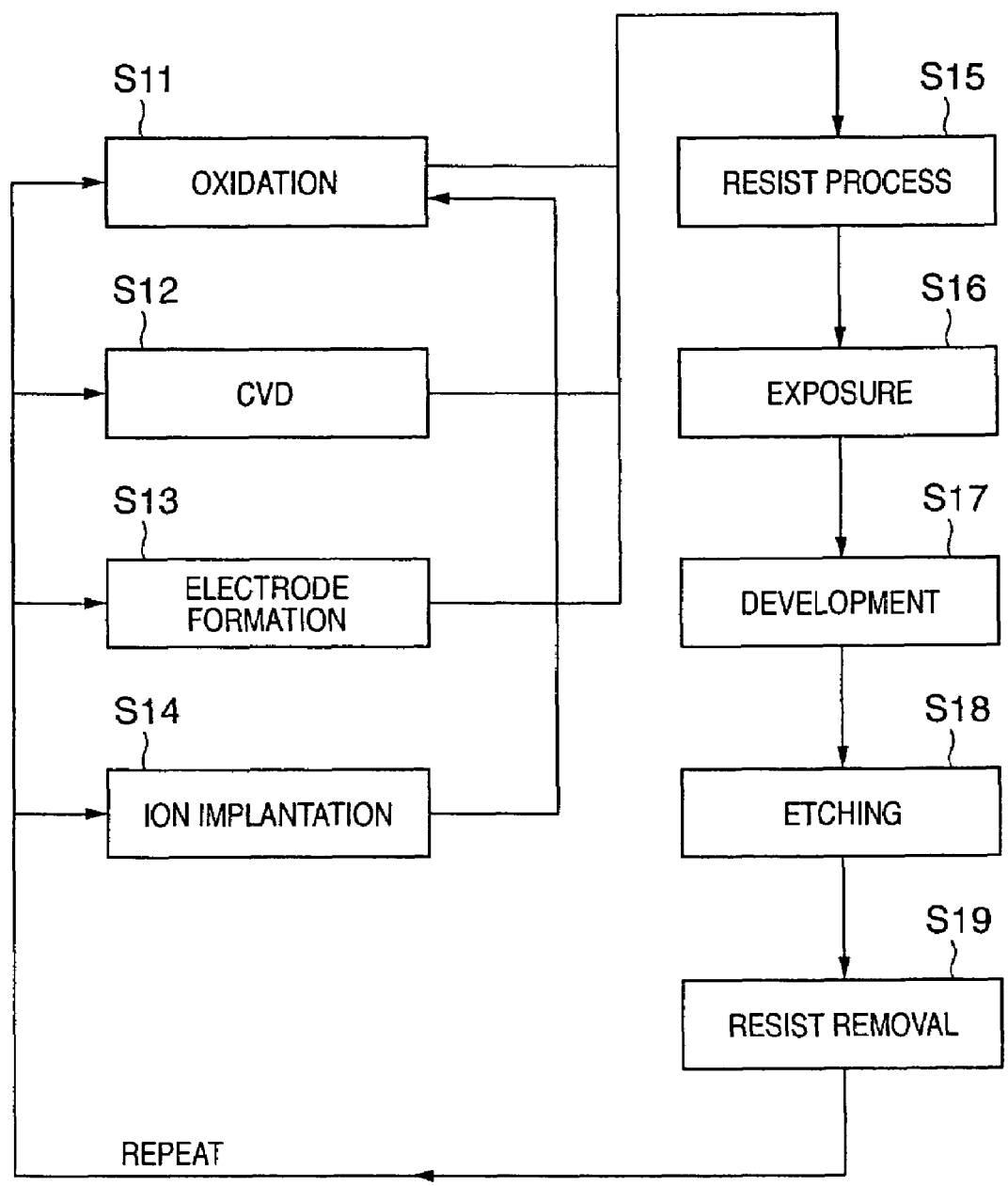
FIG. 9 is a detailed flowchart of step S4 shown in FIG. 8.

FIG. 9 is detailed flowchart of the wafer process of step S4 shown in FIG. 8. In step S11 (oxidation), the surface of the wafer is oxidized. In step S12 (CVD), an insulating film is formed on the surface of the wafer. In step S13 (electrode formation), an electrode is formed on the wafer by deposition, or the like. In step S14 (ion implantation), ions are implanted in the wafer. In step S15 (resist process), a photosensitive agent is applied to the wafer. In step S16 (exposure), the wafer is exposed to light via the mask by the exposure apparatus described above. In step S17 (development), the exposed wafer is developed. In step S18 (etching), portions other than the developed resist image are removed. In step S19 (resist removal), any unnecessary resist after etching is removed. These steps are repeated to form multiple circuit patterns on the wafer.

The device manufacturing method, which provides the same effect as that of the exposure apparatus described above, is also directed to the device itself, which is an intermediate and final result. Such a device includes a semiconductor device, such as an LSI or VLSI, a CCD, an LCD, a magnetic sensor, a thin film magnetic head, and the like.

According to the device manufacturing method of this embodiment, a decrease in reflectance caused by contamination can be detected accurately without providing any new detection system (hardware). Thus, a high-quality device can be manufactured stably. Since an optical component that causes an inconvenience can be identified, the apparatus downtime required for maintenance can be shortened. As a result, a high production capability can be exhibited.

According to the embodiments described above, a decrease in reflectance caused by the degradation of an optical member can be discriminated by a simple structure without requiring any new detection system (hardware) to detect the decrease in reflectance. An appropriate measure can be taken on the basis of the detection performed by this detection system. Thus, an exposure apparatus, which has a high cost performance and can perform high-quality exposure, can be provided.

As many apparently widely different embodiments of the present invention can be made without departing from the spirit and scope thereof, it is to be understood that the invention is not limited to the specific embodiments thereof except as defined in the claims.

This application claims the benefit of Japanese Patent Application No. 2005 088933, filed Mar. 25, 2005, which is hereby incorporated by reference herein in its entirety.

What is claimed is:

1. An exposure apparatus which exposes a pattern of an original onto a substrate, said apparatus comprising:
   an optical system, including a reflective optical element, configured to conduct exposure light;
   a cooling mechanism configured to cool the reflective optical element included in said optical system;
   a detection unit configured to detect cooling information of said cooling mechanism and to produce a detection result; and
   a determination unit configured to determine optical characteristics of the reflective optical element based on the detection result of said detection unit and a previously stored correlation between optical characteristics of the reflective optical element and the cooling information of said cooling mechanism.

2. The exposure apparatus according to claim 1, wherein said determination unit determines whether the optical characteristics of the reflective optical element change beyond a predetermined range.

3. The exposure apparatus according to claim 2, wherein at least one of a display of (i) a message, (ii) an alarm from a speaker, (iii) cleaning of the reflective optical element, and (iv) an exchange of the reflective optical element is performed when said determination unit determines that the optical characteristics of the reflective optical element change beyond the predetermined range.

4. The exposure apparatus according to claim 1, wherein (a) the cooling information includes at least one of (i) an output value from a heater included in said cooling mechanism, (ii) power, (iii) voltage, (iv) current applied to the heater, and (v) temperature of a medium used in said cooling mechanism, and (b) the optical characteristics include a reflective optical element.

5. The exposure apparatus according to claim 1, further comprising a temperature sensor which measures the temperature of the reflective optical element and which produces a measurement result, wherein said cooling mechanism cools the reflective optical element so as to maintain a constant temperature, based on the measurement result of the temperature sensor.

6. The exposure apparatus according to claim 1, further comprising a light absorbing member configured to be retractable from an exposure light path between the reflective optical element and the substrate, and another cooling mechanism configured to cool the light absorbing member.

7. The exposure apparatus according to claim 1, further comprising an aperture stop member arranged on an exposure light path between the reflective optical element and the substrate, and another cooling mechanism configured to cool said aperture stop member.

8. The exposure apparatus according to claim 1, wherein said cooling mechanism comprises a radiation plate configured to radiate heat to the reflective optical element and a Peltier element configured to cool the radiation plate, and said detection unit detects one of a voltage and current applied to the Peltier element.

9. The exposure apparatus according to claim 1, wherein the exposure light is extreme ultraviolet light, and an exposure light path is set in a vacuum environment.

10. A method of manufacturing a device, said method comprising steps of:
    exposing a pattern of an original onto a substrate by using an exposure apparatus as defined in claim 1;
    developing the exposed substrate; and
    processing the developed substrate.

* * * * *